US010714506B2

(12) United States Patent
Li et al.

(10) Patent No.: US 10,714,506 B2
(45) Date of Patent: Jul. 14, 2020

(54) PHOTODETECTOR AND DRIVING METHOD THEREOF, DISPLAY PANEL AND DISPLAY DEVICE

(71) Applicant: BOE Technology Group Co., Ltd., Beijing (CN)

(72) Inventors: Dongsheng Li, Beijing (CN); Huili Wu, Beijing (CN); Jianming Sun, Beijing (CN); Shipei Li, Beijing (CN); Xiaolong He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 307 days.

(21) Appl. No.: 15/921,964

(22) Filed: Mar. 15, 2018

(65) Prior Publication Data

US 2019/0027499 A1    Jan. 24, 2019

(30) Foreign Application Priority Data

Jul. 18, 2017    (CN) .......................... 2017 1 0586621

(51) Int. Cl.
| | |
|---|---|
| *H01L 27/12* | (2006.01) |
| *G02F 1/133* | (2006.01) |
| *G06F 3/041* | (2006.01) |
| *H01L 31/105* | (2006.01) |

(Continued)

(52) U.S. Cl.
CPC ........ *H01L 27/124* (2013.01); *G02F 1/13306* (2013.01); *G06F 3/0416* (2013.01); *G06K 9/0004* (2013.01); *H01L 31/105* (2013.01); *G02F 2001/13312* (2013.01); *G09G 2360/148* (2013.01); *H01L 27/3269* (2013.01)

(58) Field of Classification Search
None
See application file for complete search history.

(56) References Cited

U.S. PATENT DOCUMENTS

| | | | | |
|---|---|---|---|---|
| 2010/0117991 | A1* | 5/2010 | Koyama | ............. G02F 1/13338 345/175 |
| 2010/0321356 | A1* | 12/2010 | Brown | .............. H01L 27/14643 345/207 |
| 2017/0154909 | A1* | 6/2017 | Ishizu | .................. G09G 3/3648 |

* cited by examiner

*Primary Examiner* — Benjamin C Lee
*Assistant Examiner* — Krishna P Neupane
(74) *Attorney, Agent, or Firm* — Fay Sharpe LLP

(57) ABSTRACT

A photodetector, a driving method thereof, a display panel and a display device are disclosed in the field of display technology. The photodetector includes photosensitive element, a voltage divider, a switch circuitry and a detection transistor. The photosensitive element and the voltage divider are connected in series between two power terminals. The gate of the detection transistor is connected to a first voltage dividing node between the photosensitive element and the voltage divider. Therefore, when the resistance of the photosensitive element becomes smaller under illumination, the voltage of the first voltage dividing node correspondingly rises, and the detection transistor is turned on and may output a current to a read line under the driving of a DC power terminal. The magnitude of the current is determined by the magnitude of the voltage of the first voltage dividing node. Since the current output by the detection transistor under the driving of the DC power terminal is large, the influence of the leakage current of the detection transistor on the output current may be negligible, thereby effectively improving the accuracy of fingerprint identification based on the output current.

20 Claims, 5 Drawing Sheets

(51) Int. Cl.
*G06K 9/00* (2006.01)
*H01L 27/32* (2006.01)

| 101 | the scan line S1 provides a scan signal of a first level, the switch circuitry 30 enables a conduction between a DC power terminal VDD and the first electrode of the detection transistor T0 under the action of the scan signal |

| 102 | when the resistance of the photosensitive element 10 decreases under light irradiation, the voltage of the first voltage dividing node P1 between the voltage divider 20 and the photosensitive element 10 rises, and the detection transistor T0 is turned on under the drive of the first voltage dividing node P1 and a power signal from the DC power terminal VDD and outputs a current to a read line R |

| 103 | when the scan signal provided by the scan line S1 jumps to a second level, the conduction between the DC power terminal VDD and the first electrode of the detection transistor T0 is disabled, and no signal is output to the read line R |

PHOTODETECTOR AND DRIVING METHOD THEREOF, DISPLAY PANEL AND DISPLAY DEVICE

This application claims priority to Chinese Patent Application No. 201710586621.6, filed with the State Intellectual Property Office of China on Jul. 18, 2017 and entitled "Photodetector and Driving Method thereof, Display Panel and Display Device", the entire contents of which are incorporated herein by reference.

TECHNICAL FIELD

The present disclosure relates to the technical field of fingerprint identification, and in particular to a photodetector and a driving method thereof, a display panel and a display device.

BACKGROUND

A touch display panel generally uses optical fingerprint identification technology for fingerprint identification. Specifically, a plurality of pixel units in the touch display panel or each pixel unit may be provided with a photodetector configured to detect an optical signal reflected by fingerprint lines of a user when the pixel unit emits light and generate a current signal, so that the identifier in the touch display panel can identify the fingerprint lines based on the current signal.

In the related art, the photodetector may include a photosensitive element (the photosensitive element may be a photodiode). The photosensitive element is in a cutoff state when it's not irradiated by light, whereas it functions as a diode in an on state when it is irradiated by light and may output a current to the read line in the display panel. The larger the light intensity is, the larger the output current is. During fingerprint identification, since the fingerprint is formed by a series of fingerprint ridges and fingerprint valleys on the surface of the finger skin and the light refractive index of the fingerprint ridge differs from the that of the fingerprint valley, when the pixel unit emits light, the intensity of the light reflected from the fingerprint ridge is different from the intensity of light reflected from the fingerprint valley. Thus, the magnitude of the current finally generated by the photodetector is also different. Therefore, the identifier can determine the positions of the fingerprint ridge and the fingerprint valley according to the magnitude of the current, to realize the function of fingerprint identification.

However, since the optical signal detected by the photodetector is generally weak, the magnitude of the current converted from the optical signal is also small. When there is a leakage of current in the transistor in the photodetector, the current converted from the optical signal may be interfered, affecting the accuracy of fingerprint identification.

SUMMARY

The present disclosure provides a photodetector, a driving method thereof, a display panel and a display device. The technical solutions are as follows:

In a first aspect, there is provided a photodetector. The photodetector includes a photosensitive element, a voltage divider, a switch circuitry switch circuitry and a detection transistor.

The photosensitive element has a cathode connected to a positive power terminal, and an anode connected to a first voltage dividing node, and the photosensitive element is configured to control the voltage of the first voltage dividing node in accordance with an intensity of an optical signal detected.

The voltage divider has two terminals, with one terminal connected to the first voltage dividing node, and the other terminal connected to a negative power terminal, and thereby reducing voltage distributed across the photosensitive element, The switch circuitry is connected to a DC power terminal, a scan line and a first electrode of the detection transistor and is configured to output a power signal from the DC power terminal to the detection transistor under the control of a scan signal provided by the scan line.

A gate of the detection transistor is connected to the first voltage dividing node, a second electrode of the detection transistor is connected to a read line, and the detection transistor is configured to output a current to the read line under the control of the first voltage dividing node and the power signal.

In some embodiments, wherein the detection transistor is a dual-gate transistor.

A first gate of the detection transistor is connected to the first voltage dividing node, a second gate of the detection transistor is connected to the negative power terminal, and the detection transistor is configured to output a current to the read line under the control of the first voltage dividing node, the power signal and the negative power terminal.

In some embodiments, the voltage divider includes a first resistor. One terminal of the first resistor is connected to the first voltage dividing node and the other terminal of the first resistor is connected to the negative power terminal.

In some embodiments, the voltage divider includes a first resistor, a second resistor and a third resistor.

One terminal of the first resistor is connected to the first voltage dividing node, and the other terminal of the first resistor is connected to the negative power terminal.

One terminal of the second resistor is connected to the positive power terminal and the cathode of the photosensitive element, and the other terminal of the second resistor is connected to a second voltage dividing node.

One terminal of the third resistor is connected to the second voltage dividing node, the other terminal of the third resistor is connected to the negative power terminal. The second gate of the detection transistor is connected to the second voltage dividing node, and the second gate of the detection transistor is connected to the negative power terminal through the third resistor.

In some embodiments, the switch circuitry includes a first transistor.

A gate of the first transistor is connected to the scan line, a first electrode of the first transistor is connected to the DC power terminal, and a second electrode of the first transistor is connected to the first electrode of the detection transistor.

In some embodiments, the photosensitive element includes a photodiode.

The photodiode has a cathode connected to the positive power terminal, and an anode connected to the first voltage dividing node.

In some embodiments, the photodetector further includes a second transistor.

A gate of the second transistor is connected to a switch signal line, a first electrode of the second transistor is connected to the positive power terminal, and a second electrode of the second transistor is connected to the cathode of the photosensitive element.

In some embodiments, the photosensitive element includes a photodiode.

The resistance of each of the resistors is equal to the resistance of an equivalent resistor of the photodiode in a cutoff state.

In some embodiments, each of the first, second and third resistors is made of a photodiode, and a shielding layer for shielding from light is provided at a side of each of the resistors close to a light emergent surface of a display panel.

In some embodiments, the detection transistor is an indium gallium zinc oxide thin film transistor.

In a second aspect, there is provided a method for driving a photodetector. The photodetector includes a photosensitive element, a voltage divider, a switch circuitry, and a detection transistor. The method includes:

providing a scan signal of a first level by a scan line, enabling by the switch circuitry a conduction between a DC power terminal and a first electrode of the detection transistor under the action of the scan signal;

when the resistance of the photosensitive element decreases under light irradiation, the voltage of a first voltage dividing node between the voltage divider and the photosensitive element being changed, and turning on the detection transistor under the drive of the first voltage dividing node and a power signal from the DC power terminal, outputting a current to a read line; and when the scan signal provided by the scan line jumps to a second level, disabling the conduction between the DC power terminal and the first electrode of the detection transistor, with no signal output to the read line.

In some embodiments, the switch circuitry includes: a first transistor; and the photodetector further includes: a second transistor. A gate of the second transistor is connected to a switch signal line, a first electrode of the second transistor is connected to a positive power terminal, and a second electrode of the second transistor is connected to the cathode of the photosensitive element.

After the scan line provides the scan signal of the first level, a switch signal output by the switch signal line is at the first level, the second transistor is turned on to enable the conduction between the positive power terminal and the cathode of the photosensitive element.

Before the scan signal provided by the scan line jumps to the second level, the switch signal jumps to the second level and the second transistor is turned off.

In some embodiments, each of the transistors is an N-type transistor, and the first level is a high level with respect to the second level.

In a third aspect, there is provided a display panel. The display panel includes: a plurality of scan lines and a plurality of read lines intersecting with one another to define a plurality of pixel regions.

A photodetector is disposed in at least one pixel region.

The photodetector includes a photosensitive element, a voltage divider, a switch circuitry and a detection transistor.

The photosensitive element has a cathode connected to a positive power terminal, and an anode connected to a first voltage dividing node, and the photosensitive element is configured to control the voltage of the first voltage dividing node in accordance with an intensity of an optical signal detected.

The voltage divider has two terminals, with one terminal connected to the first voltage dividing node, and the other terminal connected to a negative power terminal, and thereby reducing voltage distributed across the photosensitive element.

The switch circuitry is connected to a DC power terminal, one of the plurality of scan lines and a first electrode of the detection transistor, and the switch circuitry is configured to output a power signal from the DC power terminal to the detection transistor under the control of a scan signal provided by the scan line connected to the switch circuitry.

A gate of the detection transistor is connected to the first voltage dividing node, a second electrode of the detection transistor is connected to one of the plurality of read lines, and the detection transistor is configured to output a current to the read line connected thereto under the control of the first voltage dividing node and the power signal.

In some embodiments, the display panel further includes an identifier.

The identifier is connected to the plurality of read lines and is configured to detect a current on each read line and performing fingerprint identification according to the detected current.

In some embodiments, the photodetector further includes a second transistor; and the display panel further includes:

a plurality of switch signal lines arranged in parallel with any of the scan lines.

A gate of the second transistor is connected to one of the plurality of switch signal lines, a first electrode of the second transistor is connected to the positive power terminal, and a second electrode of the second transistor is connected to the cathode of the photosensitive element.

In some embodiments, a plurality of photodetectors located in the same row is connected to the same scan line; and a plurality of photodetectors located in the same column is connected to the same read line.

In a fourth aspect, there is provided a display device. The display device includes the display panel described in the third aspect.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

In order make the objects, technical solutions and advantages of the present disclosure clearer, the embodiments of the present disclosure are further described in detail below with reference to the accompanying drawings.

Figure 1:
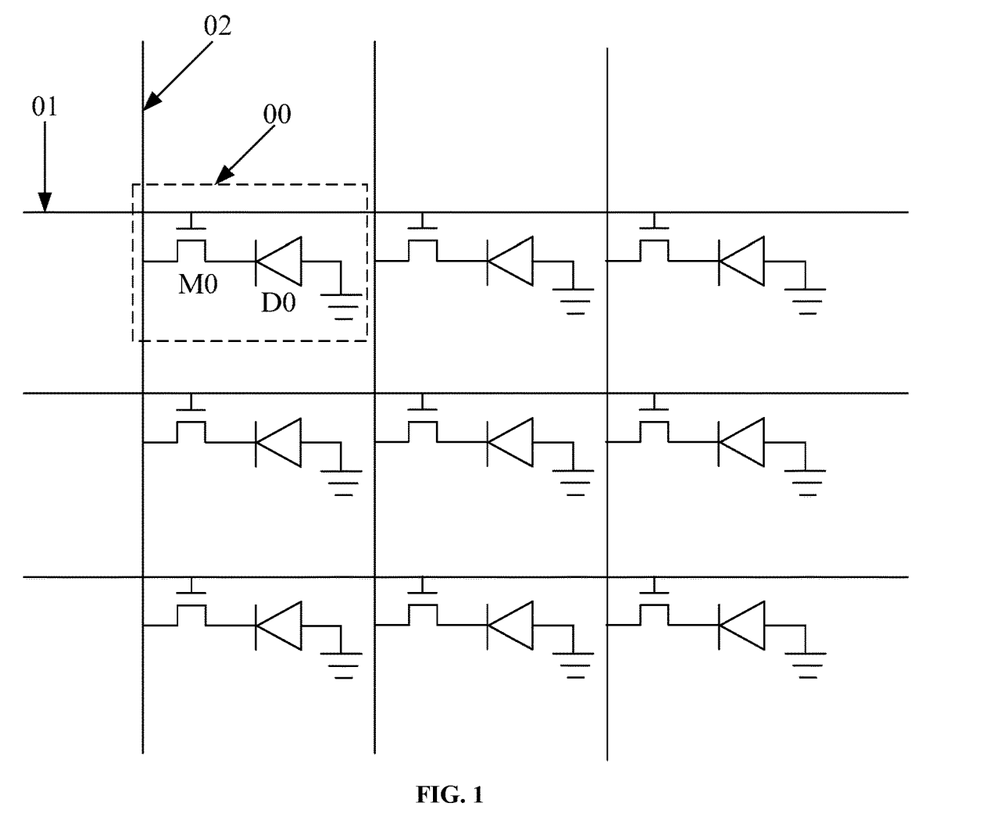
FIG. 1 is a structurally schematic diagram of a photodetector in the related art.

FIG. 1 shows a structure diagram of a photodetector in the related art. As shown in FIG. 1, a photodetector 00 may include a transistor M0 and a photosensitive element D0 (the photosensitive element in FIG. 1 is a photodiode). The gate of the transistor M0 is connected to one of a plurality of scan lines 01, the first electrode of the transistor M0 is connected to one of a plurality of read lines 02, and the second electrode of the transistor M0 is connected to the first electrode of the photosensitive element D1. The second electrode of the photosensitive element D1 is grounded. The photosensitive element D1 is a cutoff state when it's not irradiated by light, and is equivalent to a diode in an on state when it's irradiated by light, so that the photosensitive element D1 may output a current to the read line. However, since the current output to the read line by the photosensitive element D1 is generally small, when the transistor M0 has a leakage current, it may interfere with a current converted from an optical signal, thereby affecting the accuracy of fingerprint identification.

It should be noted that the transistors used in all the embodiments of the present disclosure may be thin film transistors, field effect transistors or other devices with the same characteristics. The transistors used in the embodiments of the present disclosure are mainly switch transistors according to the function thereof in a circuit. As the source and drain of the switch transistor used here are symmetrical, the source and drain are interchangeable. In the embodiments of the present disclosure, the source is referred to as a first electrode and the drain is referred to as a second electrode. According to the form in the figures, it is provided that the middle terminal of the switch transistor is the gate, the signal input terminal is the source, and the signal output terminal is the drain. In addition, the transistors used in the embodiments of the present disclosure may be P-type transistors or N-type transistors. The P-type transistor is turned on when the gate is at a low level and turned off when the gate is at a high level. The N-type transistor is turned on when the gate is at a high level and turned off when the gate is at a low level. In addition, each of the plurality of signals in the embodiments of the present disclosure has a first level and a second level. The first level and the second level only represent that the level of the signal has two state quantities, which does not mean that the first level or the second level in the text has a specific value.

Figure 2:
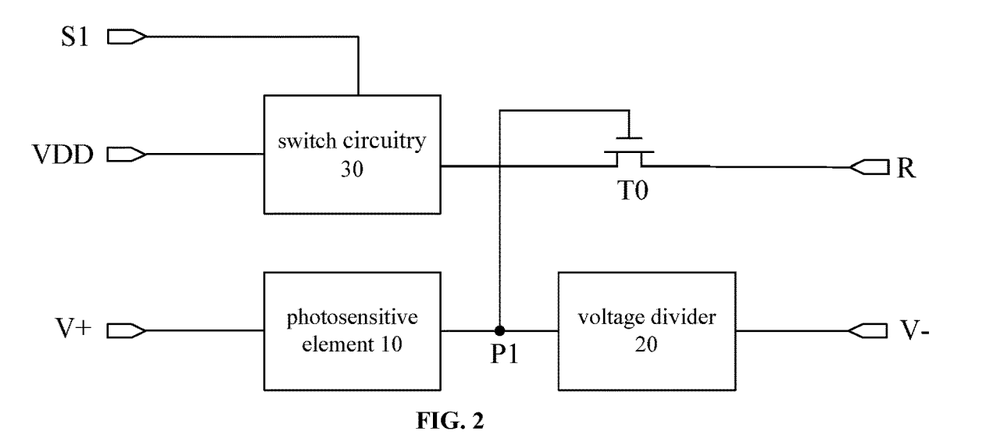
FIG. 2 is a structurally schematic diagram of a photodetector provided in an embodiment of the present disclosure.

FIG. 2 is a structural diagram of a photodetector provided in an embodiment of the present disclosure. As shown in FIG. 2, the photodetector may include a photosensitive element 10, a voltage divider 20, a switch circuitry 30 and a detection transistor T0.

The photosensitive element 10 has a cathode connected to a positive power terminal V+, and an anode connected to a first voltage dividing node P1, and the photosensitive element is configured to control the voltage of the first voltage dividing node P1 in accordance with an intensity of an optical signal detected.

The voltage divider 20 has two terminals, with one terminal connected to the first voltage dividing node P1, and the other terminal connected to a negative power terminal V−, and thereby reducing the voltage distributed across the photosensitive element 10.

The switch circuitry 30 is connected to a DC power terminal VDD, a scan line S1 and the first electrode of the detection transistor T0 and is configured to output a power signal from the DC power terminal VDD to the detection transistor T0 under the control of a scan signal provided by the scan line S1.

The gate of the detection transistor T0 is connected to the first voltage dividing node P1, the second electrode of the detection transistor is connected to a read line R for outputting a current to the read line R under the control of the first voltage dividing node P1 and the power signal.

In the embodiment of the present disclosure, as shown in FIG. 2, the photosensitive element 10 and the voltage divider 20 are connected in series between the positive power terminal V+ and the negative power terminal V−. The cathode of the photosensitive element 10 is connected to the positive power terminal V+. The photosensitive element 10 is in a cutoff state when it's not irradiated by light and has a higher resistance, and the resistance photosensitive element 10 decreases when it's irradiated by light so that the voltage of the first voltage dividing node P1 rises, thereby driving the detection transistor T0 to be turned on. If the switch circuitry 30 controls to enable the conduction between the DC power terminal VDD and the first electrode of the detection transistor T0 when the detection transistor T0 is driven to be turned on, then the detection transistor T0 may output a current to the read line R under the driving of the power signal from the DC power terminal VDD. The magnitude of the current is determined by the magnitude of the voltage of the first voltage dividing node P1, and the magnitude of the voltage of the first voltage dividing node P1 is determined by the light intensity detected by the photosensitive element 10. Therefore, the magnitude of the current finally output by the detection transistor T0 to the read line R can reflect the light intensity detected by the photosensitive element 10. Additionally, the larger the light intensity received by the photosensitive element 10 is, the smaller the resistance is, the higher the voltage of the first node P1 is, the larger the gate-source voltage difference of the detection transistor T0 is, and the larger the current output by the detection transistor T0 is. Therefore, the magnitude of the current output by the detection transistor T0 is positively correlated with the light intensity detected by the photosensitive element 10.

In summary, the embodiments of the present disclosure provide a photodetector in which a photosensitive element and a voltage divider are connected in series between two power terminals, and the gate of a detection transistor is connected to a first voltage dividing node between the photosensitive element and the voltage divider. Therefore, when the resistance of the photosensitive element becomes smaller under illumination, the voltage of the first voltage dividing node correspondingly rises, and the detection transistor is turned on and may output a current to a read line under the driving of a DC power terminal. The magnitude of the current is determined by the magnitude of the voltage of the first voltage dividing node. Since the current output by the detection transistor under the driving of the DC power terminal is large, the influence of the leakage current of the detection transistor on the output current may be negligible, thereby effectively improving the accuracy of fingerprint identification based on the output current.

Figure 3:
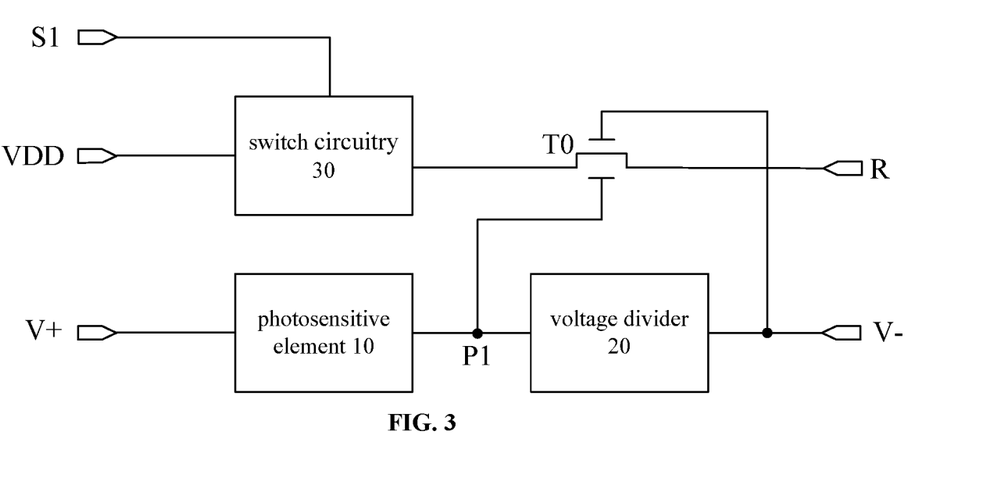
FIG. 3 is a structurally schematic diagram of another photodetector provided in an embodiment of the present disclosure.

FIG. 3 is a structural diagram of another photodetector provided according to an embodiment of the present disclosure. As shown in FIG. 3, the detection transistor T0 may be a dual-gate transistor, that is, the detection transistor T0 has two gates. The detection transistor T0 may be turned on or off under the control of the two gates.

Referring to FIG. 3, the first gate of the detection transistor T0 is connected to the first voltage dividing node P1, and the second gate of the detection transistor T0 is connected to the negative power terminal V−, and the detection transistor T0 is configured to output a current to the read line R under the control of the first voltage dividing node P1, the power signal and the negative power terminal V−.

Figure 4:
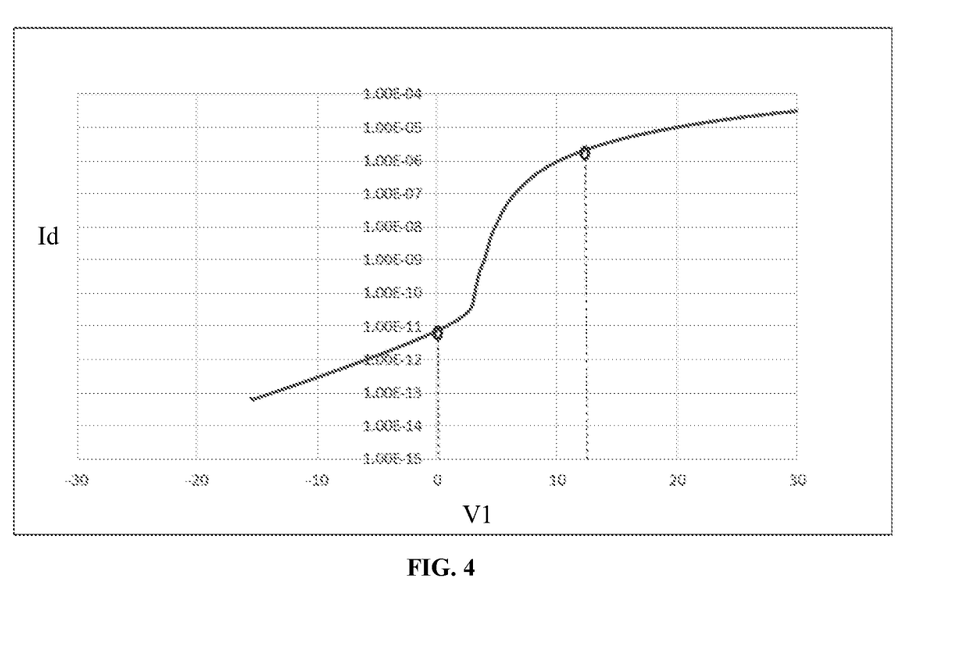
FIG. 4 is a volt-ampere (IV) characteristic curve diagram of a detection transistor provided in an embodiment of the present disclosure.

In the embodiment of the present disclosure, the detection transistor T0 may be an indium gallium zinc oxide (IGZO) thin film transistor. When the voltage of the second gate (i.e., an upper gate) of the detection transistor T0 is 0V and the voltage V1 of the first gate (i.e., a lower gate) changes between −30V and 30V, its volt-ampere (IV) characteristic curve can be as shown in FIG. 4. It can be seen from FIG. 4 that the output current Id of the detection transistor T0 increases with the increase of the voltage V1 of the first gate of the detection transistor T0 (that is, the voltage of the first node P1).

Assuming that in the photodetector, the voltage of the DC power terminal VDD is 15V, the voltage of the positive power terminal V+ is 15V, the voltage of the negative power terminal V− is −15V, the photosensitive element 10 is in a cutoff state when in a dark state, and the resistance the photosensitive element 10 is equal to the resistance of the voltage divider 20, then the voltage of the first node P1 is 0 and the detection transistor T0 is turned off. Assuming that after the resistance of the photosensitive element 10 decreases in an illuminated state, the voltage of the first node P1 may be controlled to rise to 12V, and the detection transistor T0 is turned on. It can be seen from FIG. 4 that when the voltage V1 of the first gate of the detection transistor T0 changes from 0 to 12V, the order of magnitude of the output current Id increases from 1.00E-11 (i.e. 1.00× 10-11) to 1.00E-6. The order of magnitude of the output current Id increases by nearly 5 orders of magnitude, that is, the switching ratio of the detection transistor T0 is close to 5 orders of magnitude. The switching ratio of the transistor is the ratio of the current of the transistor in an ON state to the current of the transistor in an OFF state, which reflects the operating characteristics of the transistor. The larger the switching ratio is, the larger the operating current of the transistor is, the smaller the leakage current is, the higher the signal-to-noise ratio is, and the more it is conducive to signal collection.

Therefore, in the photodetector provided in the embodiments of the present disclosure, the gate of the detection transistor T0 is connected to the first voltage dividing node P1. Even if the change in the voltage of the first voltage dividing node P1 is controlled to be small by the photosensitive element 10 in an illuminated state, the change in the current output by the detection transistor T0 to the read line R is still large, so that the effect of amplifying the optical signal is realized and the sensitivity and the detecting accuracy of the photodetector are improved.

Figure 5:
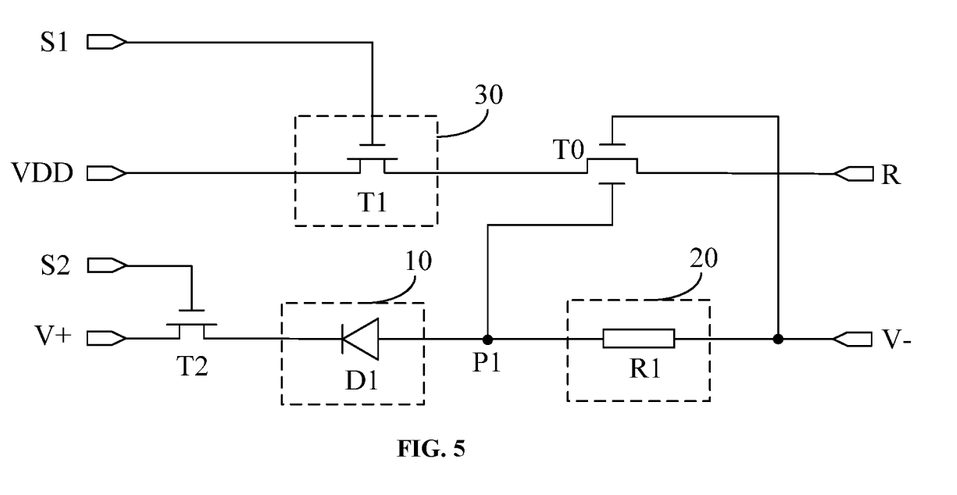
FIG. 5 is a structurally schematic diagram of yet another photodetector provided in an embodiment of the present disclosure.

FIG. 5 is a structural diagram of yet another photodetector provided according to an embodiment of the present disclosure. In an optional implementation of the embodiment of the present disclosure, as shown in FIG. 5, the voltage divider 20 may include a first resistor R1.

One terminal of the first resistor R1 is connected to the first voltage dividing node P1, and the other terminal of the first resistor R1 is connected to the negative power terminal V−. The resistance of the photosensitive element 10 becomes smaller when it's irradiated by light. In the case that the voltage of positive power terminal V+ and the negative power terminal V− is constant, the division voltage of the first resistor R1 correspondingly rises, that is, the voltage of the first voltage dividing node P1 rises, and the detection transistor T0 may be controlled to be turned on.

Figure 6:
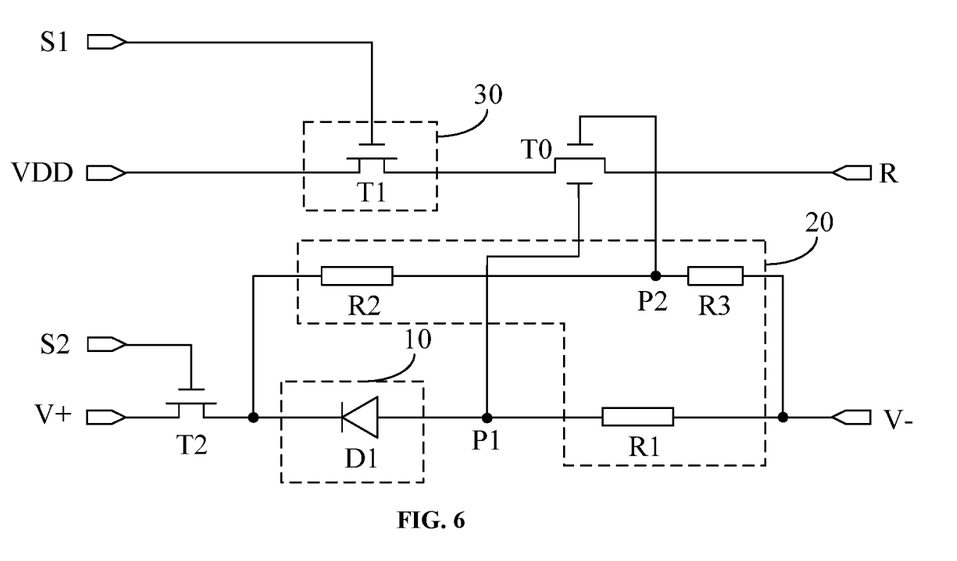
FIG. 6 is a structurally schematic diagram of yet another photodetector provided in an embodiment of the present disclosure.

FIG. 6 is a structural diagram of yet another photodetector provided according to an embodiment of the present disclosure. In another optional implementation of the embodiment of the present disclosure, as shown in FIG. 6, the voltage divider 20 may specifically include a first resistor R1, a second resistor R2 and a third resistor R3.

One terminal of the first resistor R1 is connected to the first voltage dividing node P1, and the other terminal of the first resistor R1 is connected to the negative power terminal V−.

One terminal of the second resistor R2 is connected to the positive power terminal V+ and the cathode of the photosensitive element 10, and the other terminal of the second resistor R2 is connected to a second voltage dividing node P2.

One terminal of the third resistor R3 is connected to the second voltage dividing node P2, the other terminal of the third resistor R3 is connected to the negative power terminal V−. The second gate of the detection transistor T0 is connected to the second voltage dividing node P2, and the second gate of the detection transistor T0 is connected to the negative power terminal V− through the third resistor R3.

In the structure shown in FIG. 6, the voltage divider 20 and the photosensitive element 10 form a bridge circuit. The first voltage dividing node P1 and the second voltage dividing node P2 are two output terminals of the bridge circuit respectively. The two gates of the detection transistor T0 may be respectively connected to the two output terminals of the bridge circuit.

By adding the second resistor R2 and the third resistor R3, the voltage of the second voltage dividing node P2 (that is, the voltage value of the second gate of the detection transistor T0) can be adjusted by adjusting the resistances of the two resistors so as to better control and adjust the volt-ampere characteristic of the detection transistor T0.

In the photodetector shown in FIG. 6, if the resistances of the first through the third resistors are equal and the resistance of an equivalent resistor of the photosensitive element 10 in a dark state is equal to the resistance of each resistor, then the voltages of the first voltage dividing node P1 and the second voltage dividing node P2 are both 0 and the detection transistor T0 is turned off in a dark state. In a bright state, the resistance of the photosensitive element 10 becomes smaller, the voltage of the first voltage dividing node P1 rises, the voltage of the second voltage dividing node P2 is maintained at 0, and the detection transistor T0 is turned on. If the conduction between the DC power terminal VDD and the first electrode of the detection transistor T0 is enabled, the detection transistor T0 can output a current to the read line R and the magnitude of the output current is positively correlated with the magnitude of the voltage of the first voltage dividing node P1.

Figure 7:
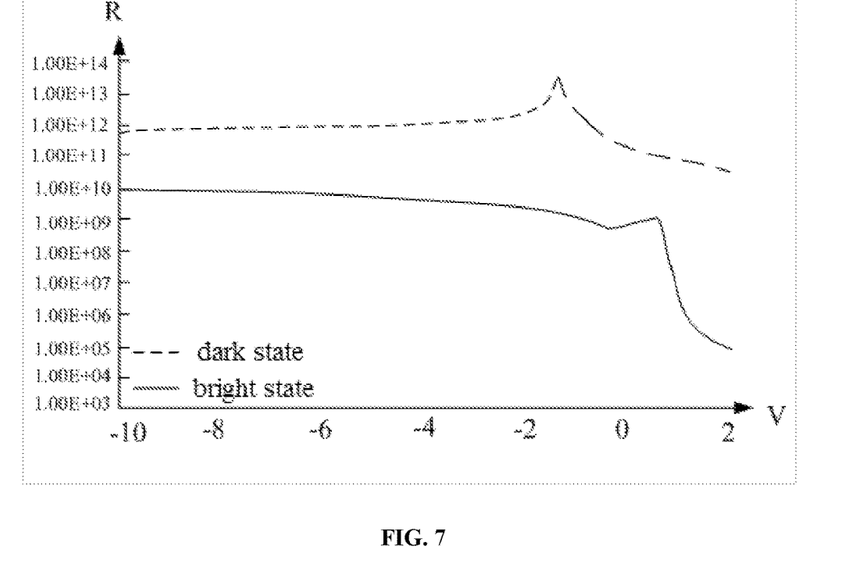
FIG. 7 is a schematic diagram of a resistance-voltage change of a photodiode provided in an embodiment of the present disclosure.

Further, referring to FIG. 5 and FIG. 6, it can be seen that the photosensitive element 10 may include a photodiode D1, for example, a PIN photodiode. The cathode of the photodiode D1 is connected to the positive power terminal V+, and the anode of the photodiode D1 is connected to the first voltage dividing node P1. The photodiode D1 is always in a reverse-biased state. FIG. 7 is a schematic diagram of the resistance-voltage change of a photodiode provided according to an embodiment of the present disclosure. In FIG. 7, the dotted line indicates the change of the resistance R of the photodiode with the voltage V when the photodiode is in a dark state, and the solid line indicates the change of the resistance R of the photodiode with the voltage V when the photodiode is in a bright state (that is, under illumination). It can be seen from FIG. 7 that when the voltage V applied to two terminals of the photodiode D1 is constant, the resistance R of the photodiode D1 in a dark state is relatively large, while the resistance R of the photodiode D1 in a bright state decreases significantly.

It should be noted that in practice, four identical photodiodes may be fabricated at the same time when the first to third resistors are fabricated. Then, a shielding layer for shielding from light (such as a metal shielding layer) is formed at one side of each of three photodiodes facing the light emergent surface of a display panel such that the three photodiodes may be always in a cutoff state. Thus, the three photodiodes may be equivalent to the first to third resistors. This manufacturing method is simpler than that of making the resistors directly. Therefore, in the embodiment of the present disclosure, the resistance of each of the first to third resistors may be equal to the resistance of the equivalent resistor of the photodiode D1 in a cutoff state.

In some embodiments, as shown in FIG. 5 and FIG. 6, the switch circuitry 30 may include a first transistor T1.

The gate of the first transistor T1 is connected to the scan line S1, the first electrode of the first transistor T1 is connected to the DC power terminal VDD, and the second electrode of the first transistor T1 is connected to the first electrode of the detection transistor T0. When the scan signal provided by the scan line S1 is at a first level, the first transistor T1 is turned on, and the conduction between the DC power terminal VDD and the first electrode of the detection transistor T0 is enabled.

In some embodiments, as shown in FIG. 5 and FIG. 6, the photodetector may further include a second transistor T2.

The gate of the second transistor T2 is connected to the switch signal line S2, the first electrode is connected to the positive power terminal V+, and the second electrode is connected to the cathode of the photosensitive element 10. The second transistor T2 can control to enable or disable the conduction between the positive power terminal V+ and the photosensitive element 10, so as to improve the flexibility in controlling the photodetector.

In summary, the embodiments of the present disclosure provide a photodetector in which a photosensitive element and a voltage divider are connected in series between two power terminals, and the gate of a detection transistor is connected to a first voltage dividing node between the photosensitive element and the voltage divider. Therefore, when the resistance of the photosensitive element becomes smaller under illumination, the voltage of the first voltage dividing node correspondingly rises, and the detection transistor is turned on and may output a current to a read line under the driving of a DC power terminal. The magnitude of the current is determined by the magnitude of the voltage of the first voltage dividing node. Since the current output by the detection transistor under the driving of the DC power terminal is large, the influence of the leakage current of the detection transistor on the output current may be negligible, thereby effectively improving the accuracy of fingerprint identification based on the output current.

Figure 8:
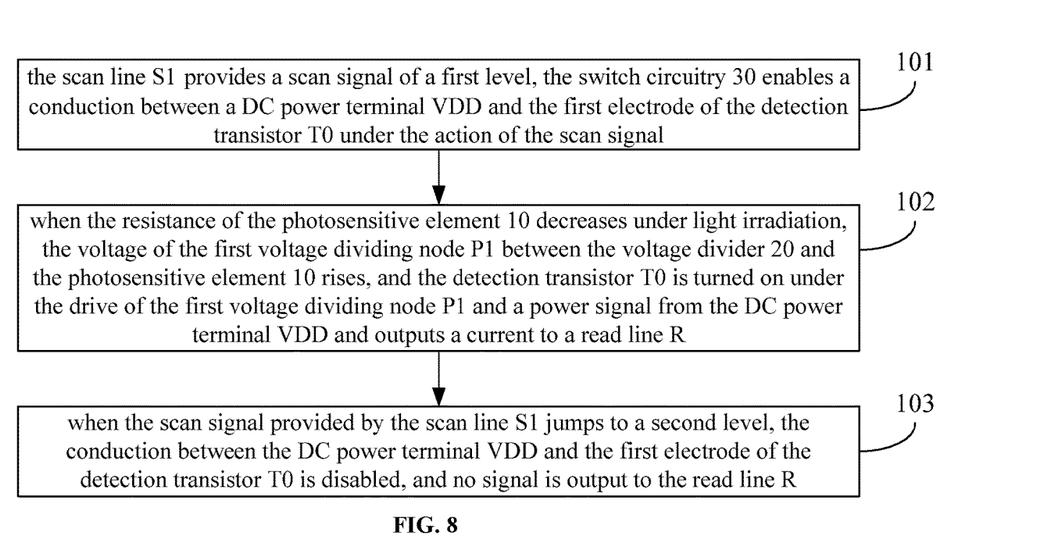
FIG. 8 is a flow chart of a method for driving a photodetector provided in an embodiment of the present disclosure.

FIG. 8 is a flow chart of a method for driving a photodetector provided in an embodiment of the present disclosure. As shown in FIGS. 2 and 3, the photodetector may include: a photosensitive element 10, a voltage divider 20, a switch circuitry 30 and a detection transistor T0. Referring to FIG. 8, the method may include following steps.

Step 101: a scan line S1 provides a scan signal of a first level, the switch circuitry 30 enables the conduction between a DC power terminal VDD and the first electrode of the detection transistor T0 under the action of the scan signal.

Step 102: when the resistance of the photosensitive element 10 decreases under light irradiation, the voltage of a first voltage dividing node P1 between the voltage divider 20 and the photosensitive element 10 rises, and the detection transistor T0 is turned on under the drive of the first voltage dividing node P1 and a power signal from the DC power terminal VDD and outputs a current to a read line R.

Step 103: when the scan signal provided by the scan line S1 jumps to a second level, the conduction between the DC power terminal VDD and the first electrode of the detection transistor T0 is disabled, and no signal is output to the read line R.

In some embodiments, as shown in FIG. 5 and FIG. 6, the switch circuitry 30 may include a first transistor T1. The photosensitive element 10 may be a photodiode D1. The voltage divider 20 may include a first resistor R1, or may also include a first resistor R1, a second resistor R2 and a third resistor R3. The photodetector may further include a second transistor T2.

Figure 9:
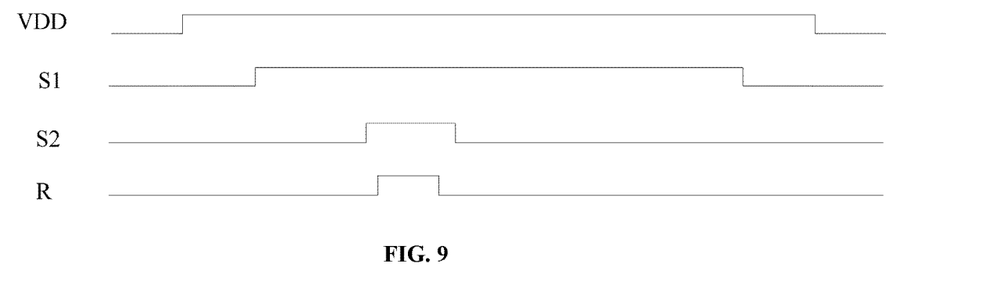
FIG. 9 is a timing diagram of signal ends during a process of driving a photodetector provided in an embodiment of the present disclosure.

The driving principle of the photodetector will be described in detail by taking the photodetector shown in FIG. 5 or FIG. 6 as an example. This embodiment is described by taking an example in which each transistor is an N-type transistor and the first level is a high level with respect to the second level. FIG. 9 is a timing diagram of each signal terminal during the process of driving a photodetector provided according to an embodiment of the present disclosure.

In combination with FIGS. 5, 6 and 9, when the scan signal provided by the scan line S1 jumps to the first level, the first transistor T1 is turned on, the first electrode of the detection transistor T0 is connected to the DC power terminal VDD, and the DC power terminal VDD may provide a power signal of the first level.

Further, when the switch signal output from the switch signal line S2 jumps to the first level, the second transistor T2 is turned on, and the conduction between the positive power terminal V+ and the cathode of the photodiode D1 is enabled. When the photodiode D1 is irradiated by light, the resistance of the photodiode D1 decreases, the voltage of the first voltage dividing node P1 rises, and the voltage of the second gate of the detection transistor T0 is the voltage of the negative power terminal V− (corresponding to the structure shown in FIG. 5) or the voltage of the second voltage dividing node P2 (corresponding to the structure shown in FIG. 6). Referring to FIG. 4, it can be seen that when the voltage of the first gate of the detection transistor T0 increases in the case that the voltage of the second gate of the detection transistor T0 is constant, the output current Id (i.e., the current output to the read line R) increases correspondingly. Additionally, as can be seen from FIG. 4, when the voltage of the first gate of the detection transistor T0 increases from 0 to about 12V, the output current Id of the detection transistor T0 increases by five orders of magnitude. Since the current output to the read line R by the detection transistor T0 is relatively large, the effect of the leakage current of the detection transistor T0 on the output current can be effectively avoided, thereby ensuring the accuracy of fingerprint identification based on the output current.

Thereafter, the switch signal provided by the switch signal line S2 jumps to the second level, the second transistor T2 is turned off, the photodiode D1 resumes the cutoff state, the voltage of the first voltage dividing node P1 becomes 0, the detection transistor T0 is turned off, and no current is output to the read line R. When the scan signal provided by the scan line S1 also jumps to the second level, the first transistor T1 is turned off, and the DC power terminal VDD is disconnected from the first electrode of the detection transistor T0. The photodetector stops operation and waits for the next scan cycle.

It should be noted that, in practice, the timing of the scan signal and the switch signal may be adjusted as required. For example, the timing of the switch signal and the scan signal may also be exactly the same, which is not limited in the embodiments of the present disclosure.

In summary, the embodiments of the present disclosure provide a method for driving a photodetector. In the photodetector, a photosensitive element and a voltage divider are connected in series between two power terminals, and the gate of a detection transistor is connected to a first voltage dividing node between the photosensitive element and the voltage divider. Therefore, during the driving process, when the resistance of the photosensitive element becomes smaller under illumination, the voltage of the first voltage dividing node correspondingly rises, and the detection transistor is turned on and may output a current to a read line under the driving of a DC power terminal. The magnitude of the current is determined by the magnitude of the voltage of the first voltage dividing node. Since the current output by the detection transistor under the driving of the DC power terminal is large, the influence of the leakage current of the detection transistor on the output current may be negligible, thereby effectively improving the accuracy of fingerprint identification based on the output current.

It should be noted that, all of the above embodiments are described by taking an example in which each transistor is an N-type transistor and the first level is a high level with respect to the second level. Of course, each of the transistors may also be a P-type transistor. When each of the transistors is a P-type transistor, the first level may be a low level with respect to the second level, and the level change of each of the signal terminals may be reverse to the level change shown in FIG. 9.

Figure 10:
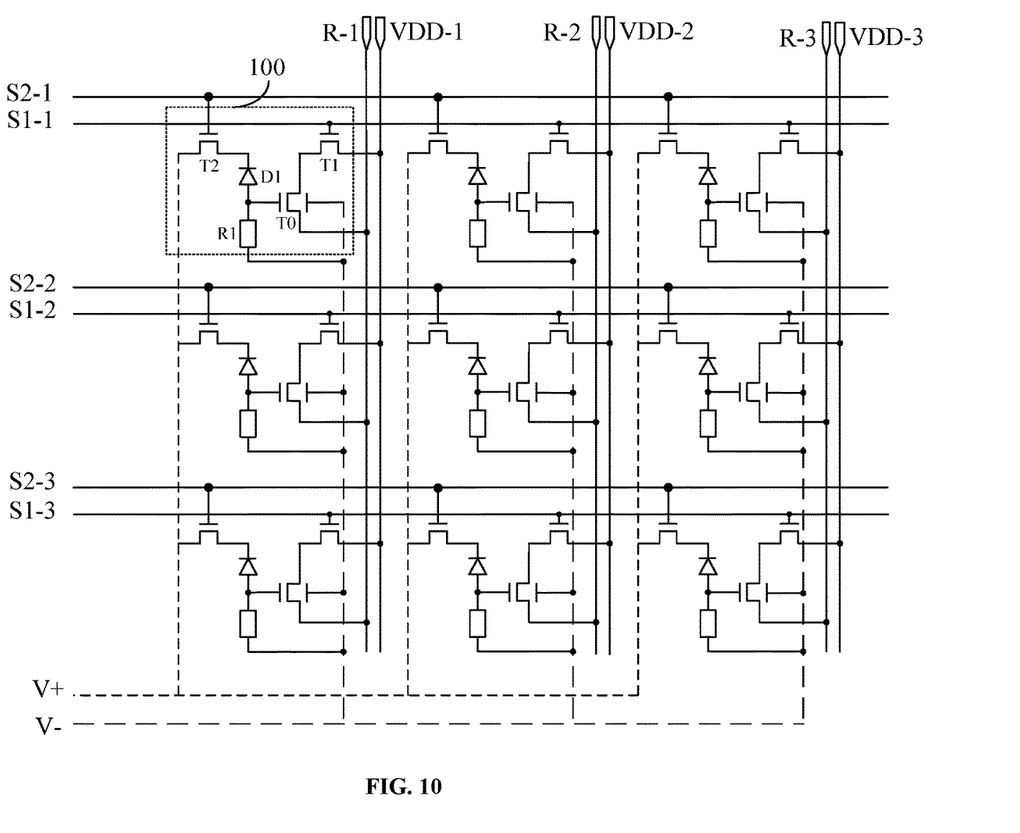
FIG. 10 is a structurally schematic diagram of a display panel provided in an embodiment of the present disclosure.

FIG. 10 is a structural diagram of a display panel provided according to an embodiment of the present disclosure. Referring to FIG. 10, the display panel may include a plurality of scan lines S1 and a plurality of read lines R that intersect to define a plurality of pixel regions. A photodetector as shown in any one of FIG. 2, FIG. 3, FIG. 5, and FIG. 6 may be disposed in at least one pixel region.

As can be seen from FIG. 10, the display panel further includes a plurality of switch signal lines S2 (e.g., switch signal lines S2-1 to S2-3) disposed in parallel to the scan line S1 and a plurality of power lines disposed in parallel to the read line R. Each photodetector may be connected to the DC power terminal VDD, the positive power terminal V+ and the negative power terminal V− through the plurality of power lines respectively.

For example, each row of photodetectors in the display panel may be connected to the same switch signal line, and each column of photodetectors may be connected to the DC power terminal VDD via the same power line, to the positive power terminal V+ via the same power line, or to the negative power terminal V− via the same power line.

In some embodiments, the display panel may further include an identifier (not shown in FIG. 10). The identifier may be connected to the plurality of read lines R and configured to detect the current on each read line R and perform fingerprint identification based on the detected current.

During the fingerprint detection, the plurality of scan lines S1 may output scan signals at a first level sequentially along a preset direction (e.g., a direction in which the gate driving circuit scans the display panel), and the plurality of switch signal lines S2 may sequentially output switch signals at a first level. When the scan lines scan any row of pixel units, if any photodetector in this row of pixel units detects an optical signal, a current may be output to the corresponding read line R so that the identifier performs the fingerprint identification according to the current transmitted on the plurality of read lines R.

For example, the scan lines S1-1 to S1-3 may sequentially output scan signals at a first level. Correspondingly, the switch signal lines S2-1 to S2-3 may sequentially output switch signals at a first level. When both the scan signal output from the scan line S1-1 and the switch signal output from the switch signal line S2-1 are at a first level, the photodetectors in the first row of pixel units are in an operating state. When the photodetector 100 detects the optical signal, a current may be output to the corresponding read line R-1, so that the identifier identifies the fingerprint lines according to the magnitude of the current.

The embodiments of the present disclosure further provide a display device. The display device may include the display panel shown in FIG. 10. The display device may be a liquid crystal panel, an electronic paper, an OLED panel, an AMOLED panel, a mobile phone, a tablet computer, a television, a display, a laptop, a digital frame, a navigator or any other product or part with a display function.

Those skilled in the art may clearly understand that, for the convenience and simplicity of the description, reference may be made to the corresponding processes in the foregoing method embodiments for the specific operating process of the photodetectors and modules described above, which will not be described here again.

The foregoing are only some embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A photodetector, comprising: a photosensitive element, a voltage divider, a switch circuitry and a detection transistor, wherein
    the photosensitive element has a cathode connected to a positive power terminal, and an anode connected to a first voltage dividing node, and the photosensitive element is configured to control a voltage of the first voltage dividing node in accordance with an intensity of an optical signal detected;
    the voltage divider has two terminals, with one terminal connected to the first voltage dividing node, and the other terminal connected to a negative power terminal, and thereby reducing voltage distributed across the photosensitive element;
    the switch circuitry is connected to a DC power terminal, a scan line and a first electrode of the detection transistor, and is configured to output a power signal from the DC power terminal to the detection transistor under the control of a scan signal provided by the scan line; and a gate of the detection transistor is connected to the first voltage dividing node, a second electrode of the detection transistor is connected to a read line, and the detection transistor is configured to output a current to the read line under the control of the first voltage dividing node and the power signal.

2. The photodetector according to claim 1, wherein the detection transistor is a dual-gate transistor;

a first gate of the detection transistor is connected to the first voltage dividing node, a second gate of the detection transistor is connected to the negative power terminal, and the detection transistor is configured to output a current to the read line under the control of the first voltage dividing node, the power signal and the negative power terminal.

3. The photodetector according to claim 2, wherein the voltage divider comprises:

a first resistor, a second resistor and a third resistor; wherein one terminal of the first resistor is connected to the first voltage dividing node, and the other terminal of the first resistor is connected to the negative power terminal;

one terminal of the second resistor is connected to the positive power terminal and the cathode of the photosensitive element, and the other terminal of the second resistor is connected to a second voltage dividing node; and one terminal of the third resistor is connected to the second voltage dividing node, the other terminal of the third resistor is connected to the negative power terminal, the second gate of the detection transistor is connected to the second voltage dividing node, and the second gate of the detection transistor is connected to the negative power terminal through the third resistor.

4. The photodetector according to claim 3, wherein the photosensitive element comprises: a photodiode; wherein a resistance of each of the resistors is equal to a resistance of an equivalent resistor of the photodiode in a cutoff state.

5. The photodetector according to claim 4, wherein each of the resistors is made of a photodiode, and a shielding layer for shielding from light is provided at a side of each of the resistors close to a light emergent surface of a display panel.

6. The photodetector according to claim 1, wherein the voltage divider comprises:

a first resistor, wherein one terminal of the first resistor is connected to the first voltage dividing node and the other terminal of the first resistor is connected to the negative power terminal.

7. The photodetector according to claim 6, wherein the photosensitive element comprises: a photodiode; wherein a resistance of the first resistor is equal to a resistance of an equivalent resistor of the photodiode in a cutoff state.

8. The photodetector according to claim 7, wherein the first resistor is made of a photodiode, and a shielding layer for shielding from light is provided at a side of the first resistor close to a light emergent surface of a display panel.

9. The photodetector according to claim 1, wherein the switch circuitry comprises: a first transistor; wherein a gate of the first transistor is connected to the scan line, a first electrode of the first transistor is connected to the DC power terminal, and a second electrode of the first transistor is connected to the first electrode of the detection transistor.

10. The photodetector according to claim 1, wherein the photosensitive element comprises: a photodiode; wherein a cathode of the photodiode is connected to the positive power terminal, and an anode of the photodiode is connected to the first voltage dividing node.

11. The photodetector according to claim 1, further comprising: a second transistor, wherein a gate of the second transistor is connected to a switch signal line, a first electrode of the second transistor is connected to the positive power terminal, and a second electrode of the second transistor is connected to the cathode of the photosensitive element.

12. The photodetector according to claim 1, wherein the detection transistor is an indium gallium zinc oxide thin film transistor.

13. A method for driving a photodetector, wherein the photodetector comprises: a photosensitive element, a voltage divider, a switch circuitry, and a detection transistor; and the method comprises:

providing a scan signal of a first level by a scan line, enabling by the switch circuitry a conduction between a DC power terminal and a first electrode of the detection transistor under the action of the scan signal;

when a resistance of the photosensitive element decreases under light irradiation, a voltage of a first voltage dividing node between the voltage divider and the photosensitive element being changed, and turning on the detection transistor under the drive of the first voltage dividing node and a power signal from the DC power terminal, and outputting a current to a read line; and when the scan signal provided by the scan line jumps to a second level, disabling the conduction between the DC power terminal and the first electrode of the detection transistor, with no signal output to the read line.

14. The method of claim 13, wherein the switch circuitry comprises: a first transistor; and the photodetector further comprises: a second transistor, wherein a gate of the second transistor is connected to a switch signal line, a first electrode of the second transistor is connected to a positive power terminal, and a second electrode of the second transistor is connected to a cathode of the photosensitive element;

after providing by the scan line the scan signal of the first level, outputting by the switch signal line a switch signal at the first level, turning on the second transistor to enable the conduction between the positive power terminal and the cathode of the photosensitive element; and before the scan signal provided by the scan line jumps to the second level, enabling the switch signal to jump to the second level and turning off the second transistor.

15. The method of claim 14, wherein each of the transistors is an N-type transistor, and the first level is a high level with respect to the second level.

16. A display panel, comprising: a plurality of scan lines and a plurality of read lines intersecting with one another to define a plurality of pixel regions, wherein a photodetector is disposed in at least one pixel region, and the photodetector comprises: a photosensitive element, a voltage divider, a switch circuitry and a detection transistor; wherein the photosensitive element has a cathode connected to a positive power terminal, and an anode connected to a first voltage dividing node, and the photosensitive element is configured to control a voltage of the first voltage dividing node in accordance with an intensity of an optical signal detected;

the voltage divider has two terminals, with one terminal connected to the first voltage dividing node, and the other terminal connected to a negative power terminal, and thereby reducing the voltage distributed across the photosensitive element;

the switch circuitry is connected to a DC power terminal, one of the plurality of scan lines and a first electrode of the detection transistor, and the switch circuitry is configured to output a power signal from the DC power terminal to the detection transistor under the control of a scan signal provided by the scan line connected to the switch circuitry; and a gate of the detection transistor is connected to the first voltage dividing node, a second electrode of the detection transistor is connected to one of the plurality of read lines, and the detection transistor is configured to output a current to the read line connected thereto under the control of the first voltage dividing node and the power signal.

17. The display panel of claim 16, further comprising: an identifier, wherein
the identifier is connected to the plurality of read lines, and is configured to detect a current of each read line and perform fingerprint identification according to the detected current.

18. The display panel of claim 16, wherein the photodetector further comprises: a second transistor; and the display panel further comprises:
a plurality of switch signal lines arranged in parallel with any of the scan lines; wherein
a gate of the second transistor is connected to one of the plurality of switch signal lines, a first electrode of the second transistor is connected to the positive power terminal, and a second electrode of the second transistor is connected to the cathode of the photosensitive element.

19. The display panel of claim 16, wherein
a plurality of photodetectors located in the same row is connected to the same scan line; and
a plurality of photodetectors located in the same column is connected to the same read line.

20. A display device, comprising a display panel according to claim 16.

* * * * *